United States Patent [19]
Yoshida

[11] Patent Number: 5,399,997
[45] Date of Patent: Mar. 21, 1995

[54] OSCILLATION CIRCUIT

[75] Inventor: Ryuhei Yoshida, Nagaokakyo, Japan

[73] Assignee: Murata Manufacturing Co., Ltd., Kyoto, Japan

[21] Appl. No.: 37,259

[22] Filed: Mar. 26, 1993

[30] Foreign Application Priority Data

Mar. 30, 1992 [JP]· Japan .................. 4-105857

[51] Int. Cl.$^6$ .............................. H03B 5/32
[52] U.S. Cl. ................... 331/158; 331/176; 310/315; 310/346
[58] Field of Search .................. 331/116 R, 158, 176, 331/116 FE; 310/346, 365, 368, 315

[56] References Cited

U.S. PATENT DOCUMENTS

| | | | |
|---|---|---|---|
| 3,175,168 | 3/1965 | Miyake et al. | 331/116 R |
| 3,289,055 | 11/1966 | Aizawa et al. | 331/116 R |
| 4,313,071 | 1/1982 | Hermann et al. | 310/346 |
| 4,384,229 | 5/1983 | Inoue et al. | 310/315 |

Primary Examiner—Andrew M. Dolinar
Attorney, Agent, or Firm—Ostrolenk, Faber, Gerb & Soffen

[57] ABSTRACT

A Colpitts-type oscillation circuit, employing a ceramic resonator vibrating in the energy trapping thickness shear slide mode is disclosed in which, an antiresonance frequency of the ceramic resonator has a negative temperature characteristic which is less step than that of its resonance frequency. Capacitance between terminals of the ceramic resonator is set so that an oscillation frequency (Fosc) of the oscillation circuit at the ordinary temperature is higher than a central frequency ((Fr+Fa)/2) of the ceramic resonator. Thus, it is possible to employ a ceramic resonator having a large bandwidth ($\Delta F$), thereby improving the temperature characteristic of the oscillation frequency.

14 Claims, 4 Drawing Sheets

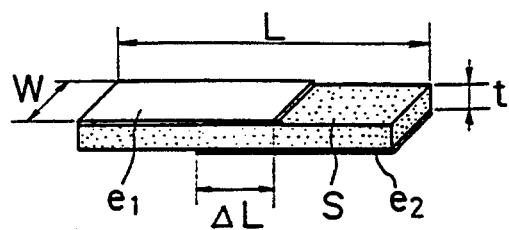
FIG. 1
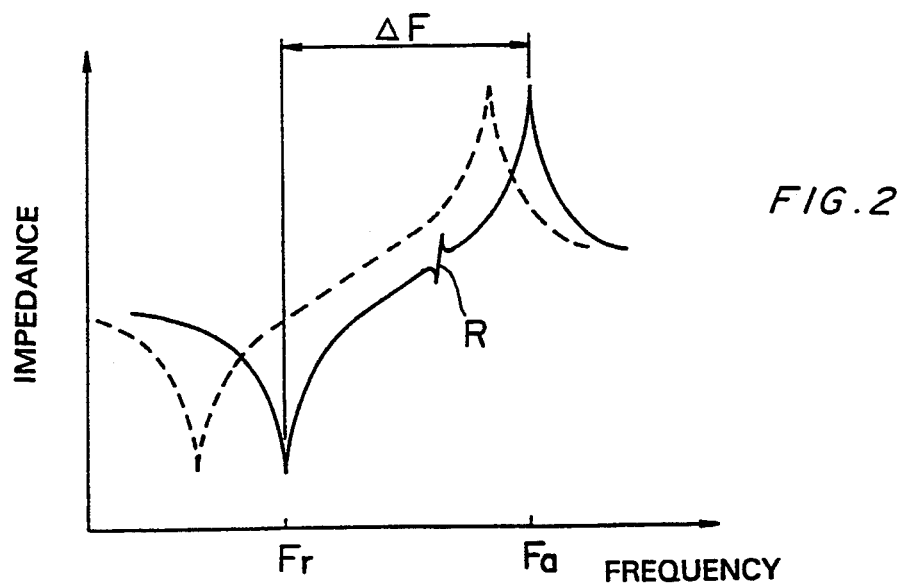
FIG. 2
FIG. 3
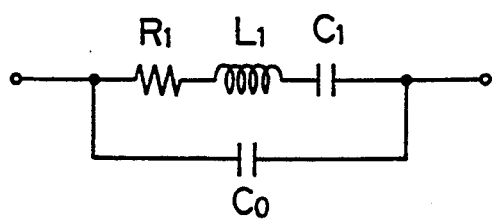
FIG. 4
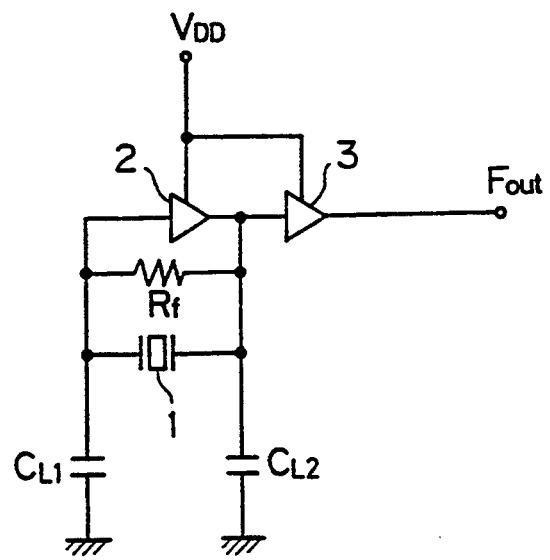

OSCILLATION CIRCUIT

BACKGROUND OF THE INVENTION

The present invention relates to an oscillation circuit of the Colpitts-type that employs a ceramic resonator which vibrates in the energy trapping thickness shear slide mode.

FIG. 1 shows a well-known ceramic resonator which vibrates in the energy trapping thickness shear slide mode. This resonator comprises a rectangular ceramic substrate S, an electrode $e_1$, which extends from an end of one major surface of the substrate S, and another electrode $e_2$, which extends from another end of the other major surface of the substrate S to partially overlap the electrode $e_1$. The resonator has an impedance characteristic shown in FIG. 2. The width W and an overlap length $\Delta L$ of the electrodes $e_1$ and $e_2$ are selected so as to prevent abnormal oscillation and to suppress a ripple R caused in the frequency band $\Delta F$ to a minimum.

The width of the frequency band $\Delta F$ is varied with the ceramic material. A ceramic resonator having a large bandwidth, i.e., having a large electromechanical coupling factor, is applicable in a wide range excluding a reference clock source for a microcomputer since such a resonator can reduce the rise time of oscillation and oscillate at a low voltage.

When a ceramic material having a large bandwidth is employed for a resonator, however, temperature characteristics of both resonance and antiresonance frequencies Fr and Fa have a negative trend the temperature characteristic of the frequency Fr is steeper in the negative trend than that of the frequency Fa. For example, an impedance characteristic of such a resonator is sifted toward the negative under high temperature, as shown by a dotted line in FIG. 2. When a resonator made of such a material is applied to a Colpitts-type oscillation circuit, therefore, its oscillation frequency Fosc also has a negative temperature characteristic, since the oscillation frequency Fosc is necessarily present between the frequencies Fr and Fa, i.e., in the frequency band $\Delta F$. Particularly, when the oscillation frequency Fosc is closer to the frequency Fr, its temperature characteristic is affected by that of the frequency Fr and is deteriorated.

In order to improve the temperature characteristic of the oscillation frequency Fosc, it is possible to shift the oscillation frequency Fosc toward the antiresonance frequency Fa by reducing load capacitance $C_L$ of the oscillation circuit. In this case, however, a high frequency gain in the circuit is increased so that the circuit could oscillate in an overtone mode to cause spurious results such as a third harmonic wave. Therefore, it is not preferred to change the load capacitance $C_L$ of the oscillation circuit.

SUMMARY OF THE INVENTION

Accordingly, a principal object of the present invention is to provide an oscillation circuit which can improve the temperature characteristic of its oscillation frequency.

Another object of the present invention is to provide an oscillation circuit which can oscillate in a short rise time at a low voltage by employing a ceramic resonator having a wide frequency band $\Delta F$.

Still another object of the present invention is to provide an oscillation circuit which can suppress spurious results such as a third harmonic wave or the like without changing load capacitance.

A further object of the present invention is to provide a simplified oscillation circuit which is easy to adjust.

The present invention provides a Colpitts-type oscillation circuit employing a ceramic resonator which vibrates in the energy trapping thickness shear slide mode. A resonance frequency Fr of the resonator has a negative temperature characteristic, while its antiresonance frequency Fa has a negative temperature characteristic which is less steep than that of the frequency Fr. Further, capacitance $C_F$ between terminals of the resonator is set so that an oscillation frequency Fosc of the circuit at the ordinary temperature is higher than a central frequency (Fr+Fa)/2 of the resonator.

It is possible to improve the temperature characteristic of the frequency Fosc by adjusting the capacitance $C_F$ between terminals of the resonator for the following reasons:

FIG. 3 shows an equivalent circuit of the ceramic resonator, whose resonance and antiresonance frequencies Fr and Fa are expressed as follows:

$$Fr = 1/2\pi \sqrt{(L_1 C_1)} \tag{1}$$

$$Fa = Fr\sqrt{(1 + C_1/C_0)} \tag{2}$$

Hence, the ratio of Fa to Fr is as follows:

$$Fa/Fr = \sqrt{(1 + C_1/C_0)} \tag{3}$$

When overlap areas of the electrodes are increased in a ceramic resonator of a certain thickness, the capacitance $C_F$ is also increased as a matter of course. The capacitance $C_F$ is expressed as the sum of equivalent series capacitance $C_1$ and equivalent parallel capacitance $C_0$:

$$C_F = C_1 + C_0 \tag{4}$$

FIG. 4 shows a Colpitts-type oscillation circuit. Referring to FIG. 4, numeral 1 denotes a ceramic resonator, numerals 2 and 3 denote C-MOS inverters, symbol $R_f$ denotes a parallel resistance, and symbols $C_{L1}$ and $C_{L2}$ denote load capacitors. An oscillation frequency Fosc of this circuit is expressed in the following equation (5). Also when the inverters 2 and 3 are replaced by transistors or TTLs, the oscillation frequency Fosc is expressed in a similar equation:

$$Fosc = Fr\sqrt{\left(1 + \frac{C_1}{C_0 + C_c}\right)} \tag{5}$$

where $C_c$ represents a value which is determined by the load capacitance of the circuit, internal capacitance of the inverters and the like.

Since the ratio ($C_1/C_0$) of the equivalent series capacitance $C_1$ to the equivalent parallel capacitance $C_0$ is substantially constant regardless of the capacitance $C_F$, the capacitance $C_1$ can be expressed as $C_1 = \alpha C_0$, where $\alpha$ represents a constant value. Substitution of this into the equation (5) gives:

$$Fosc = Fr\sqrt{\left(1 + \frac{\alpha\, C_0}{C_0 + C_c}\right)} \quad (6)$$

This equation can be transformed as follows:

$$Fosc = Fr\sqrt{\left(1 + \frac{\alpha}{1 + C_c/C_0}\right)} \quad (7)$$

When the value $C_F$ is increased in the equation (7) the value $C_0$ is also increased, whereby the ratio $C_c/C_0$ is reduced and the value Fosc is increased. Namely, the oscillation frequency Fosc can approach the antiresonance frequency Fa when the capacitance $C_F$ is increased. In other words, the temperature characteristic of the frequency Fosc can approach that of the antiresonance frequency Fa when the frequency Fosc exceeds the central frequency (Fr+Fa)/2 of the resonator. When a ceramic material having a large bandwidth is employed for a resonator, the temperature characteristic of the antiresonance frequency Fa has a negative trend which is less steep than that of the resonance frequency Fr. Therefore, the temperature characteristic of the oscillation frequency Fosc is improved when it approaches the antiresonance frequency Fa. This is the first reason for the above.

The dielectric constant $\epsilon$ of a piezoelectric material generally has a positive temperature characteristic, whereby the temperature characteristic of the capacitance $C_F$ also trends positive. Such a positive trend of the temperature characteristic of the capacitance $C_F$ also leads to a positive trend of the capacitance $C_0$, whereby the value in the root appearing in the equation (7) is increased as the temperature rises. Namely, the temperature characteristic of the frequency Fosc is positively corrected by that of the capacitance $C_F$. In this case, the temperature characteristic depends on whether or not the frequency Fosc is higher than the central frequency (Fr+Fa)/2 of the resonator, i.e., the value of the capacitance $C_F$. When the frequency Fosc is lower than the central frequency (Fr+Fa)/2, its temperature characteristic is corrected only a little due to a small influence of the capacitance $C_0$. According to the present invention, therefore, the frequency Fosc is increased so as to exceed the central frequency (Fr+Fa)/2, to be further effectively improved in temperature characteristic. This is the second reason for the above.

When the capacitance $C_F$ is increased, the temperature characteristic of the frequency Fosc becomes more improved. In this case, however, a ripple may be generated in the frequency band $\Delta F$ to cause abnormal oscillation. Therefore, it is preferable to set the capacitance $C_F$ at such a value that the frequency Fosc is slightly higher than the central frequency (Fr+Fa)/2.

According to the present invention, as hereinabove described, the capacitance $C_F$ of the ceramic resonator is set so that the frequency Fosc at the ordinary temperature is higher than the central frequency (Fr+Fa)/2 of the resonator, whereby the temperature characteristic of the frequency Fosc can be improved.

Further, the ceramic resonator has a large bandwidth, i.e., a large electromechanical coupling factor, whereby the oscillation circuit is applicable in a wide range since it can oscillate in a short rise time at a low voltage.

In addition, no spurious results such as a third harmonic wave or the like are caused since it is not necessary to change the load capacitance of the oscillation circuit. The number of components is not increased since it is not necessary to employ an additional component such as a capacitor to the circuit.

In the case of a ceramic resonator vibrating in the thickness shear slide mode which comprises a rectangular ceramic substrate and strip-shaped electrodes formed on both major surfaces thereof, further, the capacitance $C_F$ thereof can be easily changed for the following reason: the overlap areas of the electrodes can be easily adjusted by adjusting the cutting width for cutting out the ceramic substrate element from a mother substrate, or by changing the electrode printing pattern for the mother substrate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a perspective view showing a general ceramic resonator vibrating in the thickness shear slide mode;

FIG. 2 is an impedance characteristic diagram of a general ceramic resonator such as shown in FIG. 1;

FIG. 3 is an equivalent circuit diagram of a ceramic resonator;

FIG. 4 is a circuit diagram of a Colpitts-type oscillation circuit;

DESCRIPTION OF THE PREFERRED EMBODIMENTS

Four samples A to D of ceramic resonators vibrating in the thickness shear slide mode were experimentally prepared by employing lead zirconate titanate (PZT) with a wide frequency band $\Delta F$. Their shapes were similar to that shown in FIG. 1 and dimensions were set as shown in Table 1.

TABLE 1

| Sample | t(mm) | L(mm) | $\Delta$L(mm) | W(mm) |
|---|---|---|---|---|
| A(Comparative Sample) | 0.79 | 10.0 | 1.7 | 0.80 |
| B(Inventive Sample) | 0.79 | 10.0 | 1.7 | 1.20 |
| C(Comparative Sample) | 0.59 | 10.0 | 1.7 | 0.63 |
| D(Inventive Sample) | 0.59 | 10.0 | 1.7 | 0.95 |

Table 2 shows resonance frequencies Fr, antiresonance frequencies Fa, frequency bands $\Delta F$ and central frequencies (Fr+Fa)/2 of the four samples A to D.

These samples A to D were integrated into Colpitts-type oscillation circuits similar to that shown in FIG. 4, and subjected to measurement of oscillation frequencies Fosc (unit: MHz).

Respective parts of each oscillation circuit had the following values:

TABLE 2

Inverter: CD4069UBE (trade name)
$C_{L1} = C_{L2} = 15$ pF
$R_f = 1$ MΩ
$V_{DD} = 5$ V

| Sample | Fr | Fa | ΔF | (Fr + Fa)/2 | Fosc |
|---|---|---|---|---|---|
| A | 1.404 | 1.691 | 0.287 | 1.547 | 1.540 |
| B | 1.426 | 1.708 | 0.282 | 1.567 | 1.580 |
| C | 1.840 | 2.226 | 0.386 | 2.033 | 2.020 |
| D | 1.850 | 2.239 | 0.389 | 2.044 | 2.050 |

As apparent from Table 2, Fosc of the circuits employing the samples A and C were slightly lower than (Fr+Fa)/2, while Fosc of the circuits employing the samples B and D were slightly higher than (Fr+Fa)/2.

Figure 5:
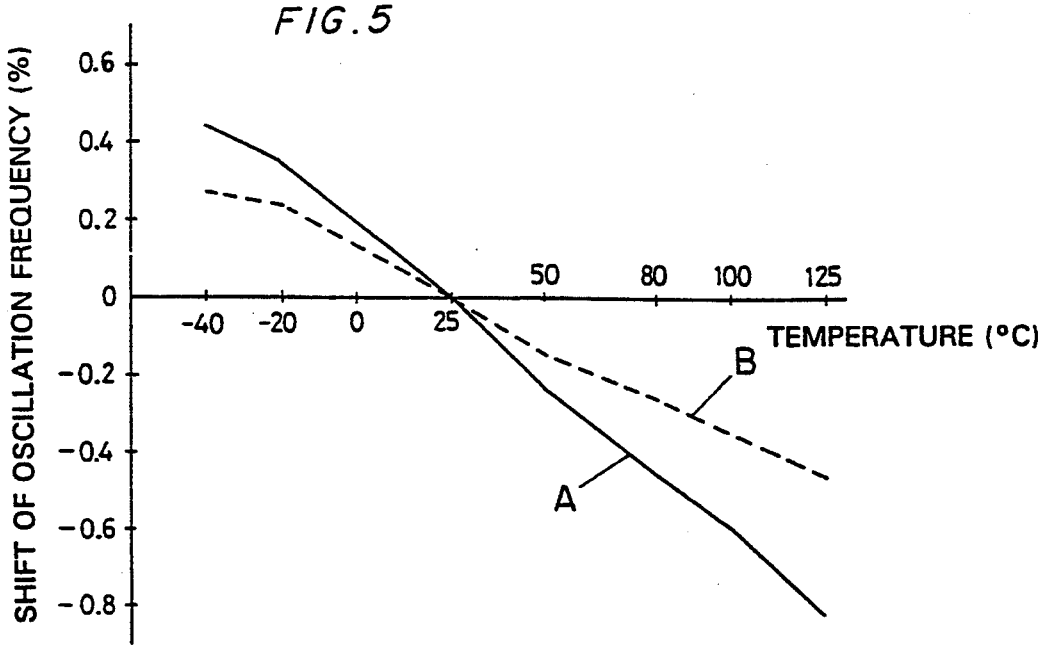
FIG. 5 illustrates temperature characteristics of oscillation frequencies of oscillation circuits employing samples A and B.
Figure 6:
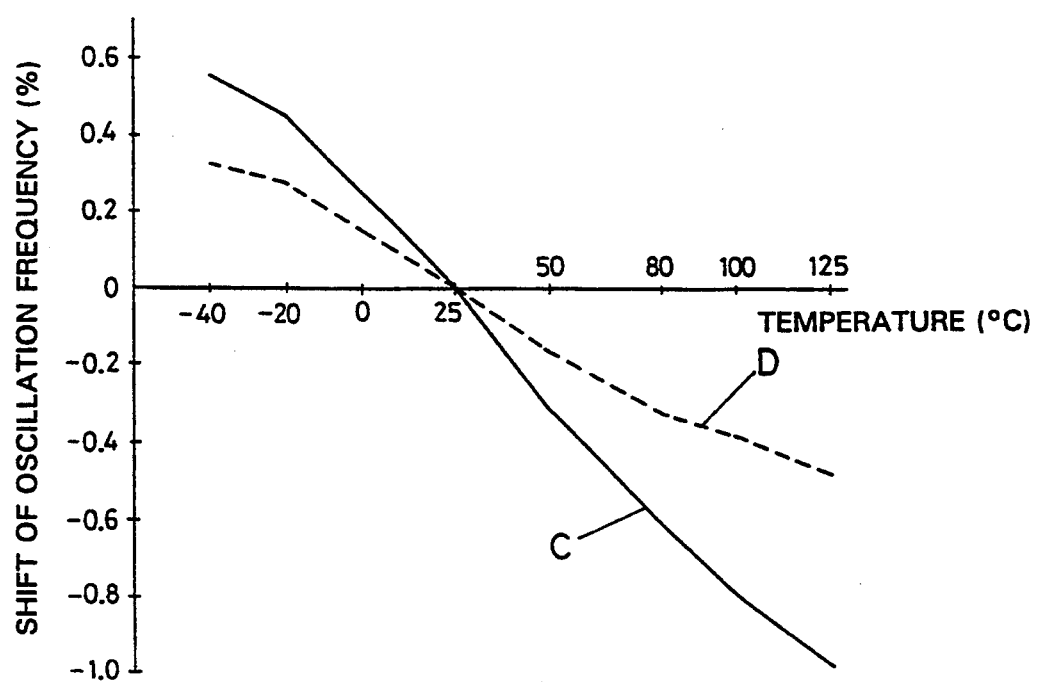
FIG. 6 illustrates temperature characteristics of oscillation frequencies of oscillation circuits employing samples C and D.
Figure 7:
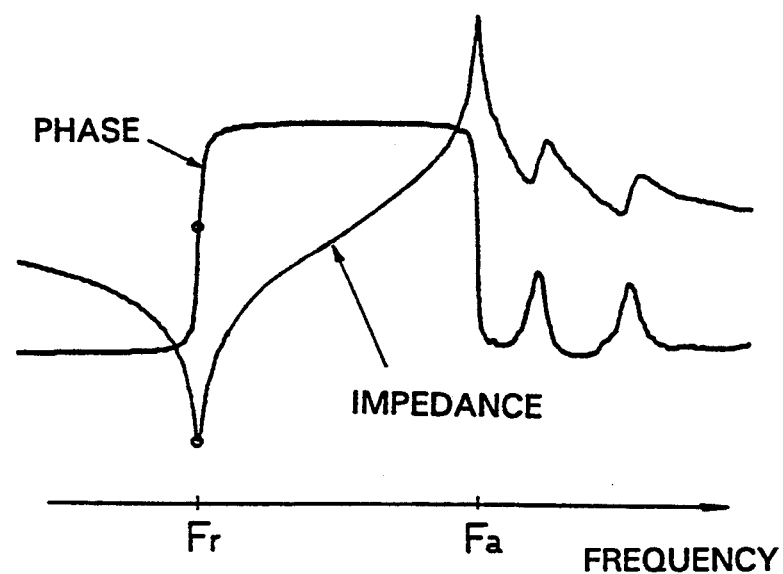
FIG. 7 illustrates impedance and phase characteristics of the sample A.
Figure 8:
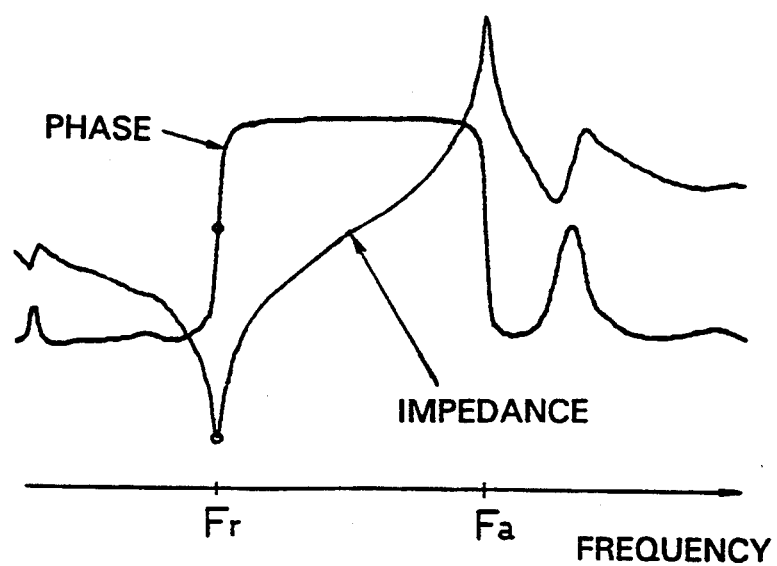
FIG. 8 illustrates impedance and phase characteristics of the sample B.
Figure 9:
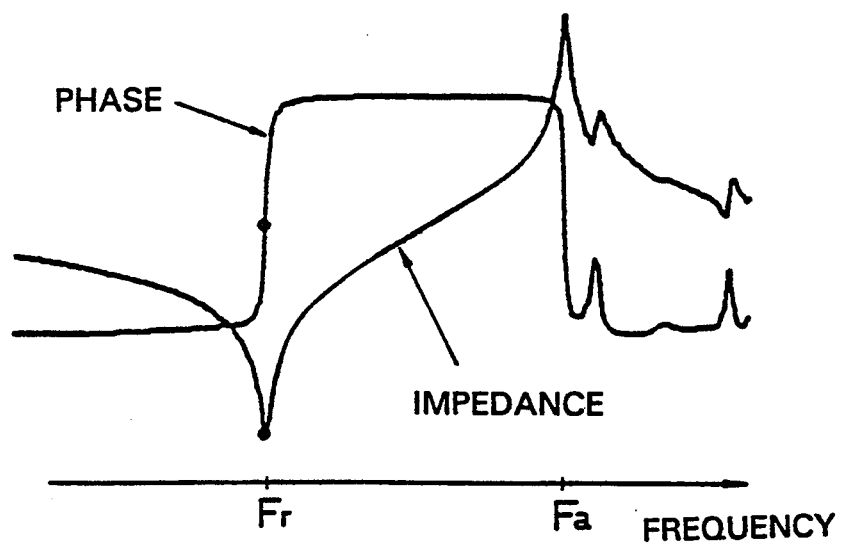
FIG. 9 illustrates impedance and phase characteristics of the sample C.
Figure 10:
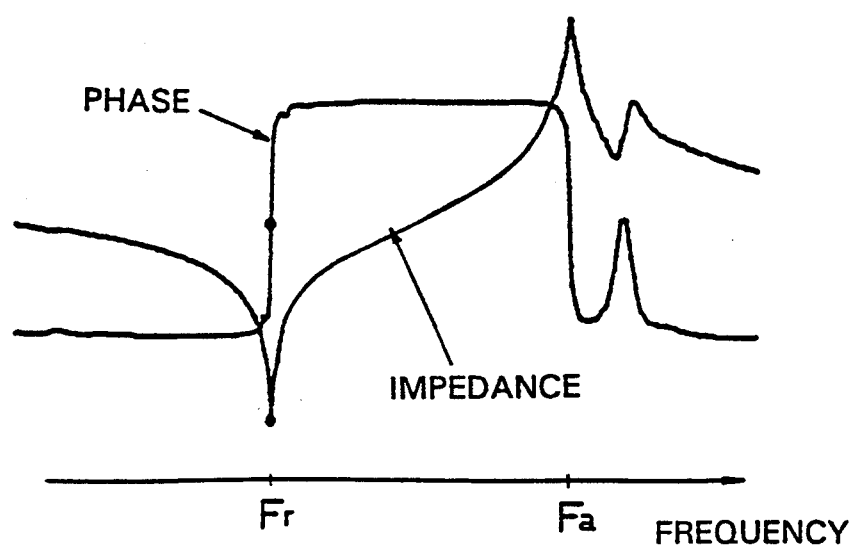
FIG. 10 illustrates impedance and phase characteristics of the sample D.

FIGS. 5 and 6 illustrate temperature characteristics of the aforementioned Fosc. It is clearly seen from FIG. 5 that when the sample B having a large width W, as compared with the sample A, is employed in circuit, the temperature characteristic of Fosc was improved with a less steep curve. It is also apparent from FIG. 6 that when the sample D having a large width W, as compared with the sample C, is employed in circuit, the temperature characteristic of Fosc was improved with a less steep curve.

Table 3 shows values of the temperature characteristics of Fosc, using the samples A to D at the ordinary temperature, obtained from FIGS. 5 and 6. As to the sample material (PZT), the temperature characteristic of Fr is −340 ppm/°C. and that of Fa is −200 ppm/°C.

TABLE 3

| Sample | Temperature Characteristic of Fosc |
|---|---|
| A | −80 ppm/°C. |
| B | −50 ppm/°C. |
| C | −106 ppm/°C. |
| D | −60 ppm/°C. |

As apparent from Table 3, the temperature characteristics of Fosc were improved as compared with Fr and Fa in all the samples A to D. Further, in the sample B where Fosc was higher than (Fr+Fa)/2, the temperature characteristic of Fosc was improved by about 40% as compared with the sample A where Fosc was lower than (Fr+Fa)/2. Similarly, in the sample D where Fosc was higher than (Fr+Fa)/2, the temperature characteristic of Fosc was improved by about 40% as compared with the sample C where Fosc was lower than (Fr+Fa)/2.

FIGS. 7 to 10 illustrate impedance and phase characteristics of the samples A to D respectively. It is understood apparent that excellent characteristics were obtained in all samples with no ripples in the frequency bands. Considering all these characteristics, it is preferable for the oscillation circuits to employ the samples B and D rather than the samples A and C.

Other than the aforementioned samples, the inventor has made an experiment as to generation of ripples with changes of overlap areas of electrodes to obtain the following results. Referring to Table 4, the term "very good" indicates results with substantially no ripples and the term "good" indicates results with slight ripples causing no problems in practice, while the term "not good" indicates results with considerable ripples caused in impractical ranges. Each of ceramic resonators employed in this experiment had a length L of 10 mm and an electrode overlap width ΔL of 1.7 mm.

TABLE 4

| Type | t(mm) | W(mm) | Characteristic |
|---|---|---|---|
| ① | 0.79 | 0.50∼0.85 | Very Good |
| ② | 0.79 | 0.90∼1.10 | Not Good |
| ③ | 0.79 | 1.15∼1.25 | Good |
| ④ | 0.59 | 0.40∼0.65 | Very Good |
| ⑤ | 0.59 | 0.70∼0.85 | Not Good |
| ⑥ | 0.59 | 0.90∼1.10 | Good |

Though slight ripples were caused in the inventive samples ③ and ⑥, as compared with the samples ① and ④, such characteristics are those of the ceramic resonators themselves. When terminals are soldered to the resonators or when the resonators are sealed with protective resin members, it is possible to suppress the ripples to a substantially negligible extent, to attain good characteristics.

According to the present invention, the amplifiers employed for the oscillation circuit are not restricted to the C-MOS inverters shown in FIG. 4, but may be formed by transistors, TTLs or the like.

In order to adjust the capacitance $C_F$, it is possible to change the overlap width ΔL of electrodes instead of changing the width W. The width W can be easily adjusted by changing the width of a ceramic substrate element cut out from a mother substrate, while the overlap width ΔL can be easily changed by the electrode printing pattern for the mother substrate.

As to the ceramic material whose resonance frequency Fr has a negative temperature characteristic and whose antiresonance frequency Fa has a negative temperature characteristic less steep than that of the resonance frequency Fr, lead titanate or the like can be used in place of PZT.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An oscillation circuit of the Colpitts-type having a ceramic resonator vibrating in the energy trapping thickness shear slide mode, wherein:

a resonance frequency Fr of said ceramic resonator has a first negative temperature characteristic, an antiresonance frequency Fa of said ceramic resonator has a second negative temperature characteristic which is less steep with respect to temperature than that of said resonance frequency Fr, and a capacitance $C_F$ between a pair of terminals of said ceramic resonator is set so that an oscillation frequency Fosc of said oscillation circuit is higher than a central frequency ((Fr+Fa)/2) of said ceramic resonator, thereby causing a temperature characteristic of said oscillation frequency to be determined more by said second negative temperature characteristic than by said first negative temperature characteristic.

2. The oscillation circuit in accordance with claim 1, wherein said capacitance $C_F$ between said terminals of said ceramic resonator is set so that said oscillation frequency Fosc is slightly higher than said central frequency $((Fr+Fa)/2)$.

3. The oscillation circuit in accordance with claim 1, wherein:
said ceramic resonator comprises a rectangular ceramic substrate, and said pair of terminals are associated respectively with a first electrode extending from one end of one major surface of said ceramic substrate along said one major surface, and a second electrode extending from an opposite end of another major surface of said ceramic substrate along said other major surface, to partially overlap with said first electrode while being separated from said first electrode by said ceramic substrate.

4. The oscillation circuit in accordance with claim 3, wherein said capacitance $C_F$ is formed between said first electrode and said second electrode where said first and second electrodes partially overlap; first and second load capacitors being connected to said first and second electrode, respectively, through said corresponding pair of terminals.

5. The oscillation circuit in accordance with claim 4, further comprising a parallel resistance between said pair of terminals; an inverter connected between said pair of terminals; and another inverter connected between an output of the aforementioned inverter and an output of the occilation circuit.

6. The oscillation circuit in accordance with claim 5, wherein the inverters are C-MOS inverters.

7. The oscillation circuit in accordance with claim 3, wherein said electrodes are strip-shaped.

8. The oscillation circuit in accordance with claim 1, wherein said oscillation frequency Fosc is higher than said central frequency $((Fr+Fa)/2)$ at ordinary room temperature.

9. The oscillation circuit in accordance with claim 1, wherein said ceramic resonator has a wide frequency band $\Delta F$ and said oscillation circuit oscillates in a short rise time at a low voltage.

10. The oscillation circuit in accordance with claim 1, wherein the temperature characteristic of said capacitance $C_F$ is positive with respect to temperature.

11. The oscillation circuit in accordance with claim 1, wherein said ceramic resonator has a width in the range from about 0.4 mm to about 1.1 mm.

12. The oscillation circuit in accordance with claim 11, wherein said ceramic resonator has a width in the range from about 0.4 mm to about 0.65 mm.

13. The oscillation circuit of claim 11, wherein said ceramic resonator has a width in the range from about 0.5 mm to about 0.85 mm.

14. A method of improving the temperature characteristic of an oscillation frequency of an oscillation circuit, comprising the steps of:
(A) providing an oscillation circuit of the Colpitts-type having a ceramic resonator vibrating in the energy trapping thickness shear slide mode, wherein:
  (i) a resonance frequency Fr of said ceramic resonator has a first negative temperature characteristic, and
  (ii) an antiresonance frequency Fa of said ceramic resonator has a second negative temperature characteristic which is less steep with respect to temperature than that of said resonance frequency Fr; and
(B) setting a capacitance $C_F$ between a pair of terminals of said ceramic resonator so that an oscillation frequency Fosc of said oscillation circuit is higher than a central frequency $((Fr+Fa)/2)$ of said ceramic resonator, thereby causing a temperature characteristic of said oscillation frequency to be determined more by said second negative temperature characteristic than by said first negative temperature characteristic.

* * * * *